United States Patent [19]

Ikeda et al.

[11] Patent Number: 5,293,327
[45] Date of Patent: Mar. 8, 1994

[54] METHOD OF LOGIC CIRCUIT SIMULATION

[75] Inventors: Mikio Ikeda; Norihiko Kotani, both of Hyogo, Japan

[73] Assignee: Mitsubishi Denki Kabushiki Kaisha, Tokyo, Japan

[21] Appl. No.: 718,686

[22] Filed: Jun. 21, 1991

[30] Foreign Application Priority Data

Jun. 25, 1990 [JP] Japan .................................. 2-166054
Apr. 26, 1991 [JP] Japan .................................. 3-096535

[51] Int. Cl.$^5$ ...................... G06F 15/60; G06F 15/20
[52] U.S. Cl. ..................................... 364/578; 364/488
[58] Field of Search .................. 364/578, 488, 489; 371/23; 395/500

[56] References Cited

U.S. PATENT DOCUMENTS

| | | | |
|---|---|---|---|
| 4,590,581 | 5/1986 | Widdoes, Jr. ................ | 364/578 |
| 4,775,950 | 10/1988 | Terada et al. ................ | 364/578 |
| 4,866,663 | 9/1989 | Griffin ......................... | 364/578 |
| 4,891,773 | 1/1990 | Ooe et al. ..................... | 364/578 |
| 4,922,445 | 5/1990 | Mizoue et al. ................ | 364/578 |
| 5,051,911 | 9/1991 | Kimura et al. ................ | 364/578 |
| 5,051,941 | 9/1991 | Takamine et al. ............. | 364/578 |
| 5,084,824 | 1/1992 | Lam et al. .................... | 364/490 |

OTHER PUBLICATIONS

"Signal Delay in General RC Networks with Application to Timing Simulation of Digital Integrated Circuit" by Lin et al., IEEE 1984 Conference on Advanced Research in VLSI, Jan. 1984, pp. 93–99.

"Signal Delay in RC Tree Networks" by Rubinstein et al., IEEE Trans. on Computer-Aided Design, vol. CAD-2, No. 3, Jul. 1983, pp. 202–210.

"Switch-Level Delay Model for Digital MOS VLSI" by J. K. Ousterhout, IEEE 21st Design Automation Conf., 1984, pp. 542–548.

Patel et al, "Newton: Logic Simulation With Circuit Simulation Accuracy for ASIC Design", *IEEE* (1986), pp. 456–459.

*Primary Examiner*—Vincent N. Trans
*Attorney, Agent, or Firm*—Lowe, Price, LeBlanc & Becker

[57] ABSTRACT

A method of logic simulation includes the steps of reading delay time of a logic element itself calculated in advance, converting output logic value of the logic element to a voltage value, forming a circuit equation based on connection information of an output impedance circuit of the logic element, calculating a voltage value at an arbitrary node of the output impedance circuit by solving the circuit equation, and converting a voltage value of an input node of a logic element of the succeeding stage to a logic value.

5 Claims, 10 Drawing Sheets

METHOD OF LOGIC CIRCUIT SIMULATION

BACKGROUND OF THE INVENTION

1. Field of the Invention

The present invention relates to logic simulation, and more particularly to improvement of accuracy of delay time simulation in a logic circuit.

2. Description of the Related Art

Today, logic simulation is utilized in design of semiconductor integrated circuits including logic circuits. One example of logic simulation is described in IEEE 1986 Custom Integrated Circuits Conference., pp. 456–459.

Logic circuit simulation is used to estimate logic operation in a logic circuit including a plurality of logic elements. In the logic simulation, logic operation is performed corresponding to level ("0" or "1") of one or more input signals in each logic element to calculate the output signal level. As to delay time of one logic element itself, there are methods of measuring the delay time of the logic element in advance, and methods of analyzing an equivalent circuit corresponding to the logic element and calculating the delay time in advance. At the time of executing the logic simulation, the output signal of one logic element is supplied later than the input signal by the delay time of one logic element calculated in advance.

In a conventional method of calculating a delay time from an input terminal of one logic element to an input terminal of a logic element at the succeeding stage in the logic simulation, the total output load capacitance $C_T$ of the logic element is taken into consideration as shown in FIG. 6. As shown in FIG. 7, a relation between the output load capacitance $C_T$ and the delay time is measured or calculated in advance by circuit simulation, and at the time of executing the logic simulation, such delay time provided in advance is utilized.

FIG. 8 is a block diagram of a conventional logic simulator, and FIGS. 9 and 10 are flow charts of the logic simulation using the logic simulator of FIG. 8.

Referring to FIGS. 8 to 10, in step S1 of FIG. 9, information of connection including a plurality of logic elements and capacitances of interconnections, delay time of logic element itself, input signals (test pattern) for testing, control data for simulation (time of analysis and the like), and a table representing relation between the output capacitance and the delay time such as shown in FIG. 6 are input to an input portion 1 of FIG. 8.

In step 2, a control portion 2 sets the analysis time t to 0 and clears an event table 3 before executing simulation. In step S3, the control portion 2 registers output terminals at which input signals have been changed, in comparison between last time and present time, among input terminals for the entire logic circuit in the event table 3. In step S4, the control portion 2 determines whether or not there is an event at present, and if there is any, the simulation proceeds to step S5.

In step S5, an evaluating portion 4 for the logic element calculates an output value corresponding to an input of the logic element at which the event has occurred. In step S6, the evaluating portion 4 for the logic element allots the delay time $t_1$ of the logic element itself for the logic element at which the event has occurred.

In step S7, a delay time calculating portion 5 calculates total sum $C_t$ of the output load capacitance on an output line of the logic element, and determines delay time $t_2$ based on the table representing the relation between the output load capacitance $C_T$ and the delay time.

In step S8, the control portion 2 registers in the event table 3 that the logic signal changes after the time lapse of $(t_1+t_2)$ from the present time at an input node of the logic element in the succeeding stage. After step S8, the simulation returns to step S4 in which whether there remains any event which has not yet been simulated at present. If there is any event which has not yet been simulated, simulation again proceeds to step S5. Otherwise, simulation proceeds to step S9 of FIG. 10.

In step S9, the control portion 2 updates simulation time from the present time to the next time. In step S10, the control portion 2 determines whether or not the present time has passed the final time of simulation. If the present time has not yet passed the final time of simulation, the simulation returns to step S3. If the present time has passed the final time of simulation, the control portion 2 provides the result of simulation to an output portion 4 in step S11, and thus the simulation is completed.

In the conventional logic simulation as described above, only the total load capacitance $C_T$ on the output line of the logic element such as shown in FIGS. 6 and 7 is taken into consideration, and resistance component on the output line, capacitance component, and an output impedance circuit including magnitude and arrangement of each of the inductance components are not considered. However, in such a logic circuit as shown in FIG. 11 (for simplicity, inductance component on the output impedance circuit is not shown), the delay time between an input node A of a logic element I and an input node B of a logic element II is estimated to be the same as the delay time between the input node A of the logic element I and an input node C of a logic element III, since only the total load capacitance on the output line of the logic element I is taken into consideration for estimating the delay time in the conventional logic simulation. However, actually the delay time between the nodes A and B is different from that between the nodes A and C, dependent on the connection information including resistance and capacitance on the output line.

As described above, in the conventional logic simulation, influence of the output impedance circuit of the logic element was not accurately taken into consideration, and therefore delay time in a logic circuit could not be estimated with sufficiently high accuracy.

SUMMARY OF THE INVENTION

In view of the problem of the prior art, an object of the present invention is to provide a method of logic simulation with improved accuracy in estimating the delay time.

The method of the present invention for simulating the delay time in a logic circuit comprises the steps of reading a delay time of a logic element itself calculated in advance, converting an output logic value of the logic element to a voltage value, forming a circuit equation based on connection information of an output impedance circuit of the logic element, calculating a voltage value at an arbitrary node in the output impedance circuit by calculating solution of the circuit equation, and converting the voltage value at an input node of a logic element in the succeeding stage to a logic value, whereby delay time between an input node of an arbitrary logic element and an input node of an arbitrary logic element in the succeeding stage can be estimated accurately.

By the logic simulation of the present invention, a voltage value at an arbitrary node in an output impedance circuit can be calculated by solving a circuit equation based on connection information of the output impedance circuit of the logic element, and accordingly, delay time between an input node of an arbitrary logic element and an input node of an arbitrary logic element of the succeeding stage can be estimated accurately.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
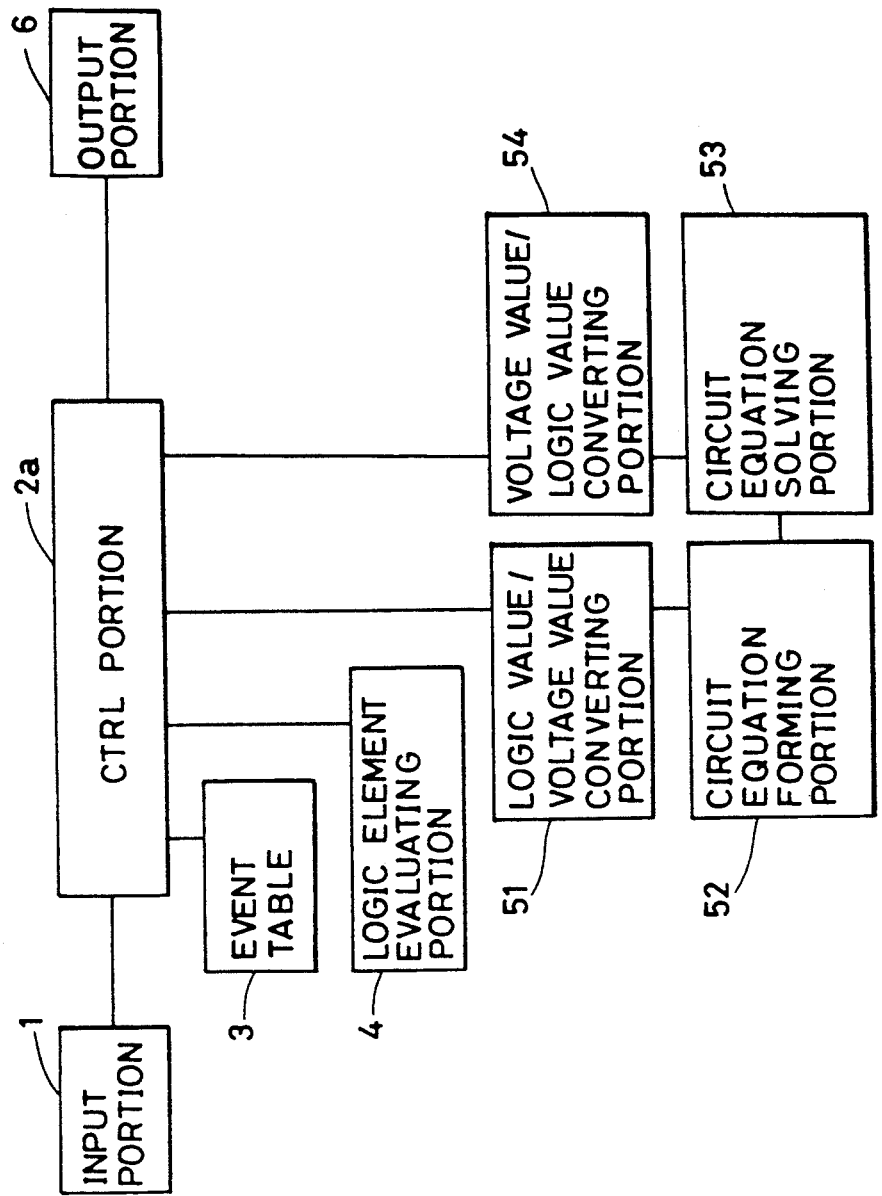
FIG. 1 is a block diagram showing a logic simulator used for the logic simulation in accordance with one embodiment of the present invention.
Figure 2:
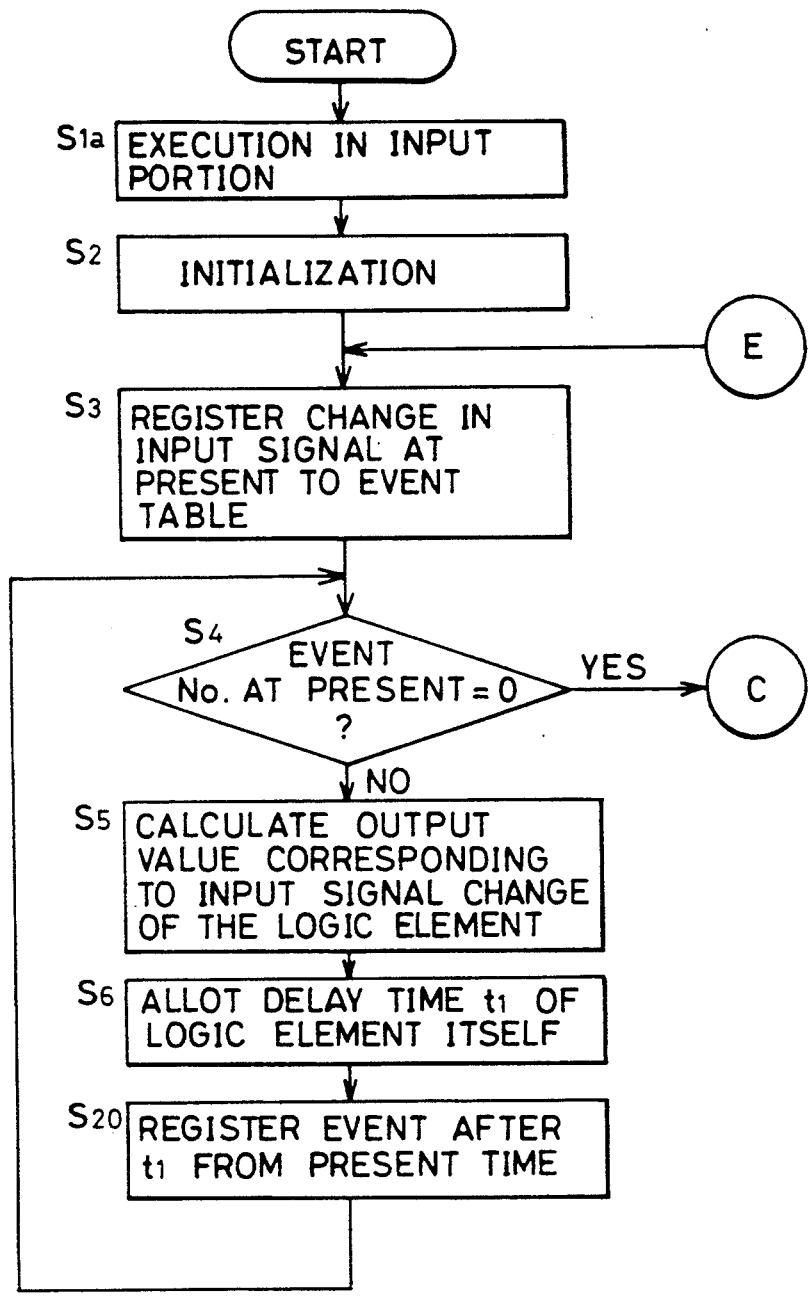
FIG. 2 shows a portion of a flow chart of the logic simulation in accordance with one embodiment of the present invention.
Figure 3:
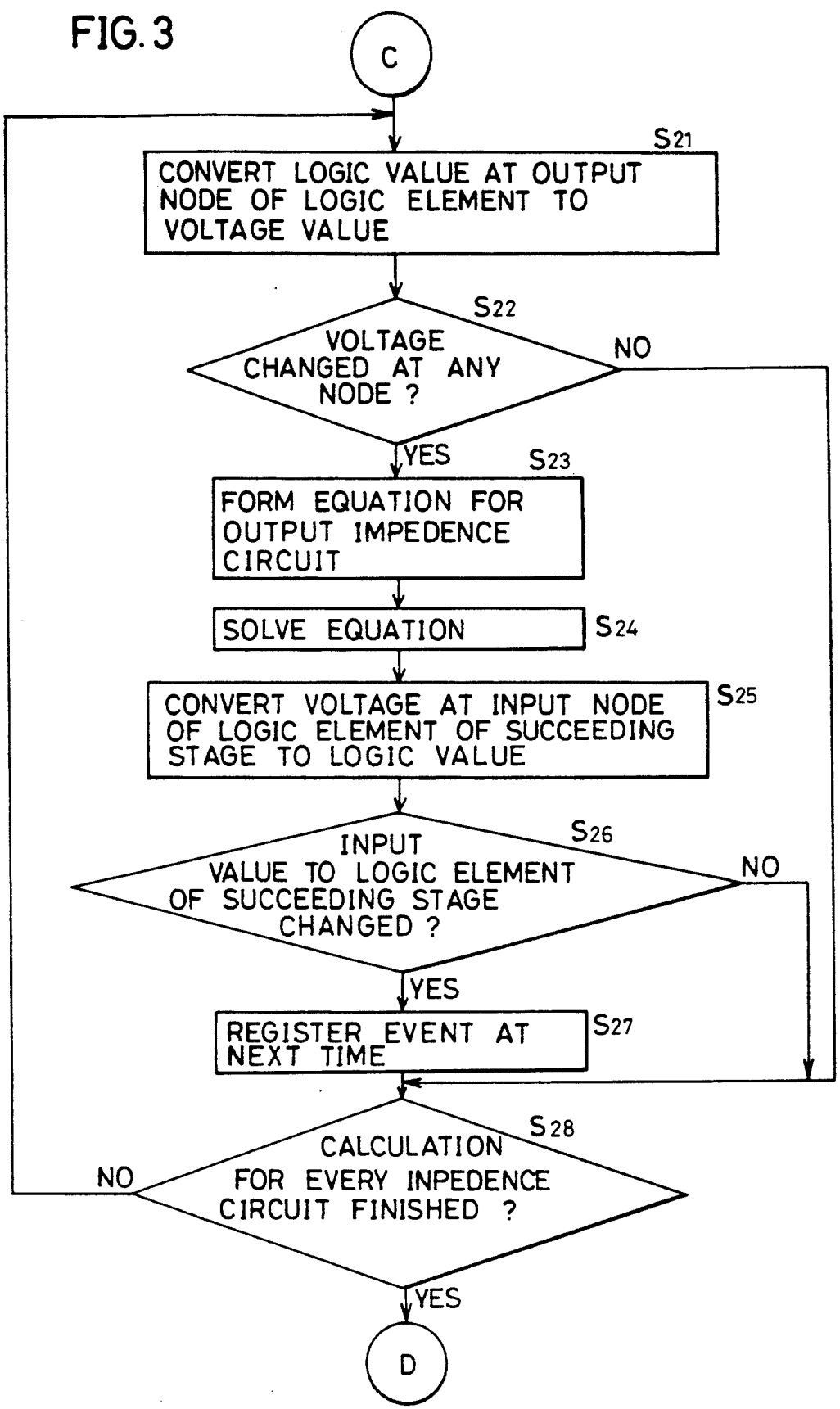
FIG. 3 shows another portion of the flow chart of logic simulation in accordance with one embodiment of the present invention.
Figure 4:
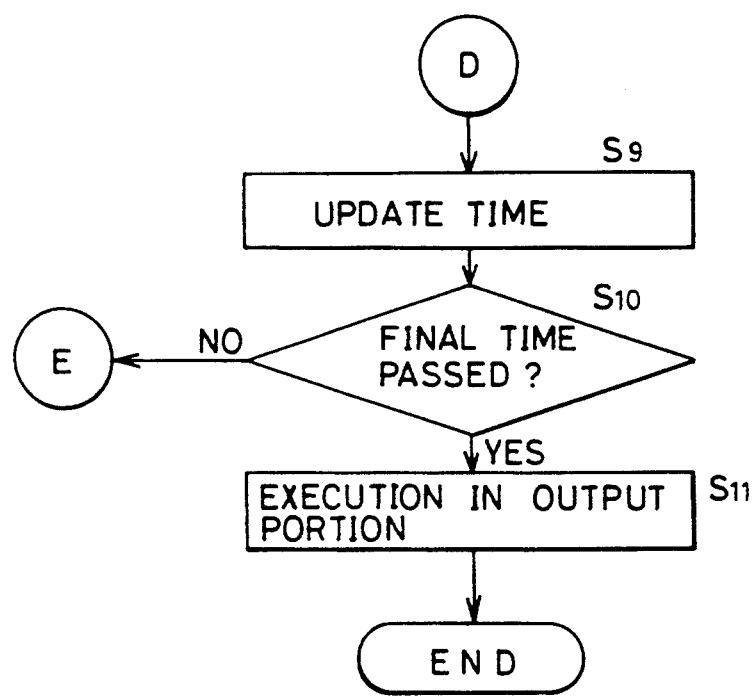
FIG. 4 shows a further portion of the flow chart of logic simulation in accordance with one embodiment of the present invention.

FIG. 1 is a block diagram of a logic simulator in accordance with one embodiment of the present invention, and FIGS. 2 to 4 show flow charts of logic simulation using the logic simulator of FIG. 1.

Referring to FIGS. 1 to 4, in step S1a, connection information including logic elements and impedance circuits between logic elements, delay time of the logic element itself (delay time in propagation of a signal from an input node to an output node of the logic element), input signals (test patterns) for testing control data for simulation (time of analysis, threshold values for voltage/logic conversion, and so on) are input to an input portion 1.

Figure 9:
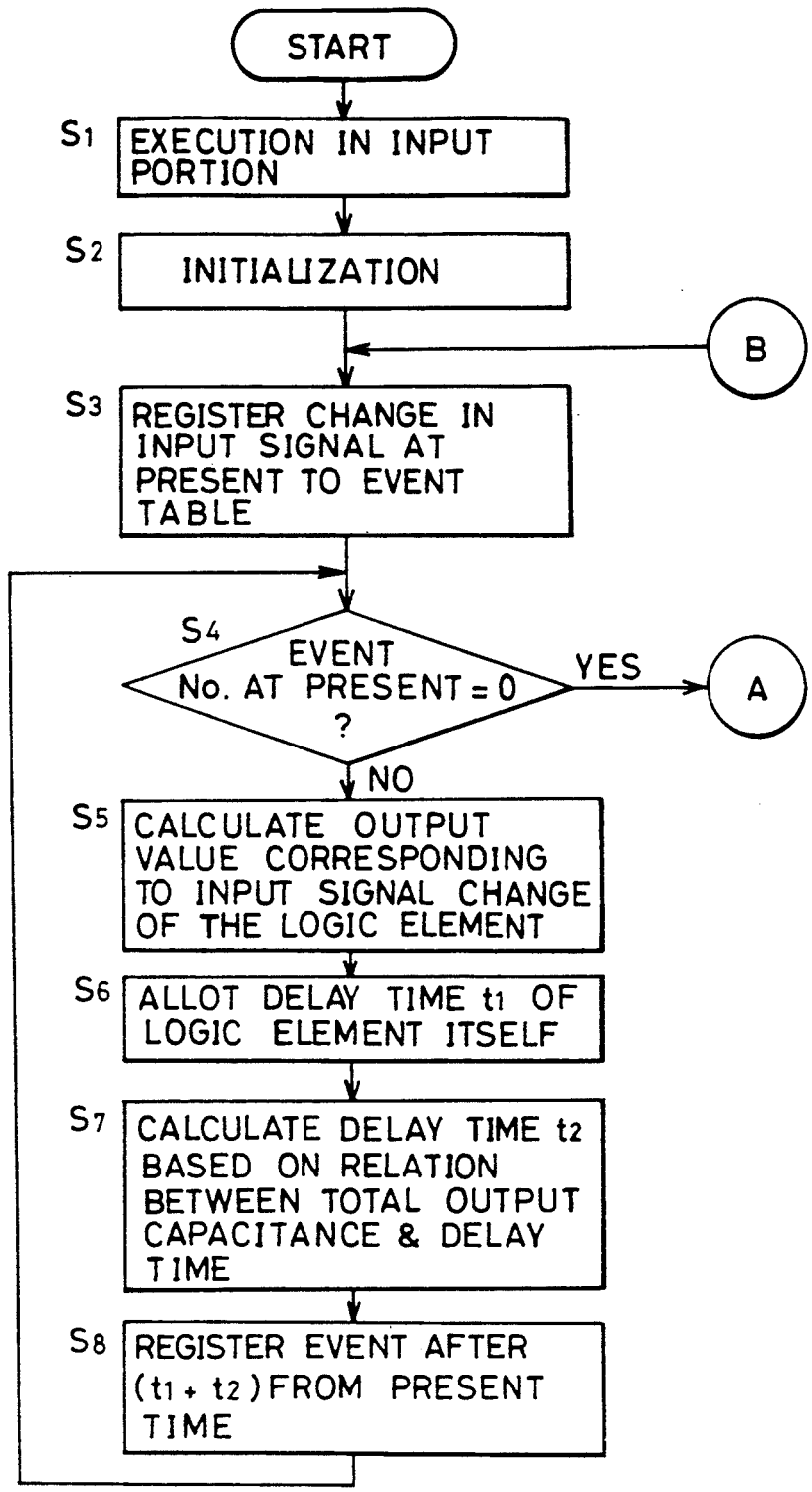
FIG. 9 shows a portion of a flow chart of the conventional logic simulation.

In steps S2 to S6, similar processing as in the corresponding steps of the prior art shown in FIG. 9 are executed.

In step S20, a control portion 2a registers in the event table 3 that a signal at the output node of the logic element changes after a time lapse of $t_n$ from the present time. After step S20, the simulation returns to step S4, and if there is no event which has not yet been simulated at present, simulation proceeds to step S21 of FIG. 3.

In step S21, the logic value/voltage value converting portion 51 of FIG. 1 converts the logic value at the output node of the logic element to a voltage value. At this time, the logic value "0" is converted to the ground voltage, and the logic value "1" is converted to the supply voltage, for example.

In step S22, the control portion 2a compares the voltage at present at each node of the output impedance circuit with the voltage immediately before, to determine whether or not there has been a voltage change at that node. If there is no change in the voltage value at the nodes of the output impedance circuit, simulation proceeds to step S28. If the voltage value has changed at one or more nodes, it proceeds to step S23.

In step S23, a circuit equation forming portion 52 of FIG. 1 forms a circuit equation with respect to the output impedance circuit of the logic element based on, for example, Kirchhoff's law.

Figure 5:
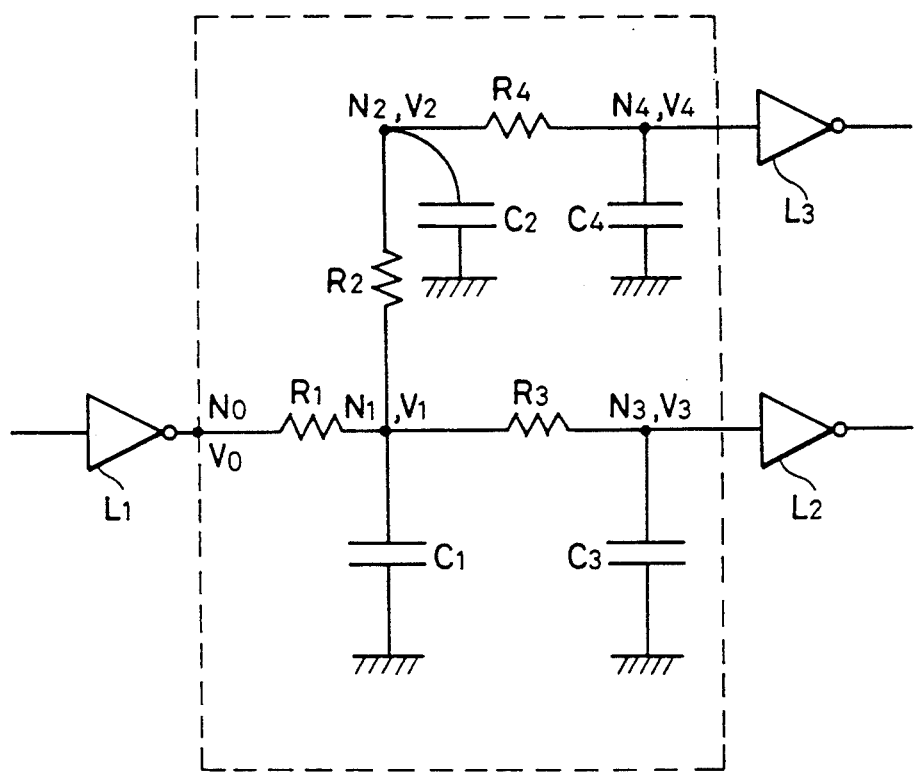
FIG. 5 shows one example of an impedance circuit between logic elements.
Figure 6:
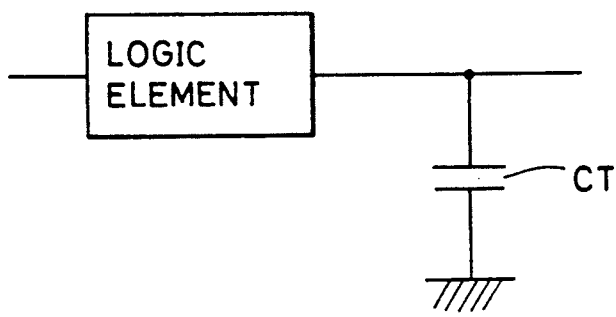
FIG. 6 shows total output load capacitance of the logic, element.
Figure 7:
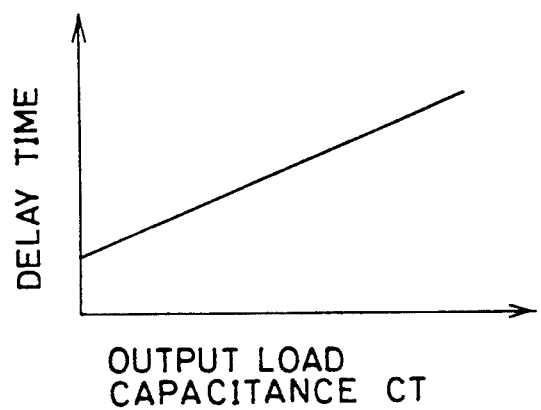
FIG. 7 is a graph showing relation between the output load capacitance of the logic element and the delay time derived therefrom.
Figure 8:
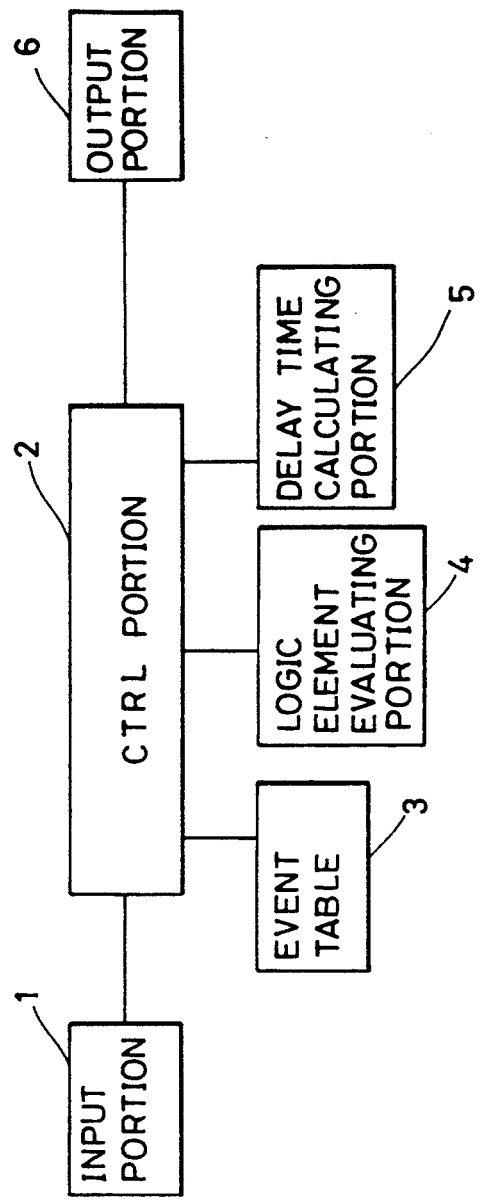
FIG. 8 is a block diagram of a logic simulator used in the conventional logic simulation.

One example of the circuit equation will be described with reference to the logic circuit of FIG. 5. An output line of a logic element L1 is connected to logic elements L2 and L3 of the succeeding stage, and an output impedance circuit of the logic element L1 is shown surrounded by a block of a dotted line. The impedance circuit includes resistances $R_1$ to $R_4$ and capacitances $C_1$ to $C_4$, and voltages at nodes $N_0$ to $N_4$ are represented by $V_0$ to $V_4$, respectively.

Generally, a current $I_R$ flowing through a resistance R is represented as $$I_R = V/R$$

when the voltage is V, and a current flowing through a capacitance C is represented as $$I_c = C(dV/dt) = C\{V(t_{n+1}) - V(T_n)\}/H$$

where $V(T_n)$ represents a voltage at a node at present, and $V(T_{n+1})$ represents the voltage at the node at the succeeding time. The reference character H represents time interval between the present time and the next time, that is, $H = t_{n+1} - t_n$.

In order to calculate voltages $V_3$ and $V_4$ at input nodes $N_3$ and $N_4$ of the logic elements L2 and L3, respectively, when the voltage $V_0$ at the output node $N_0$ of the logic element $L_1$ changes, the following four circuit equations (1) to (4) are formed based on Kirchhoff's law, for each of the nodes $N_1$, $N_2$, $N_3$ and $N_4$.

$$-(1/R_1)V_0(t_{n+1}) + (1/R_1 + 1/R_2 + 1/R_3 + C_1/H)V_1(t_{n+1}) - \quad (1)$$

$$(1/R_2)V_2(t_{n+1}) - (1/R_3)V_3(t_{n+1}) = (C_1/H)V_1(t_n)$$

$$-(1/R_2)V_1(t_{n+1}) + (1/R_2 + 1/R_4 + C_2/H)V_2(t_{n+1}) - \quad (2)$$

$$(1/R_4)V(t_{n+1}) = (C_2/H)V_2(t_n)$$

$$-(1/R_3)V_1(t_{n+1}) + (1/R_3 + C_3/H)V_3(t_{n+1}) = (C_3/H)V_3(t_n) \quad (3)$$

$$-(1/R_4)V_3(t_{n+1}) + (1/R_4 + C_4/H)V_4(t_{n+1}) = (C_4/H)V_4(t_n) \quad (4)$$

Then, in step S24 of FIG. 3, a circuit equation solving portion 52 of FIG. 1 solves the circuit equations (1) to (4). In the equations (1) to (4), the voltages $V_1(t_n)$, $V_2(t_n)$, $V_3(t_n)$ and $V_4(t_n)$ are known, since they are the voltages at present at corresponding nodes. The voltage $V_0(t_{n+1})$ is also known, since it is the output value at the next time at the output node $N_0$ of the logic element L1. Therefore, $V_1(t_{n+1})$, $V_2(t_{n+1})$, $V_3(t_{n+1})$ and $V_4(t_{n+1})$ can be calculated by solving the simultaneous equations (1) to (4). For example, when the respective values are assumed to be $C_1=C_2=C_3=C_4=10^{12}F$; $R_1=R_2=R_3=R_4=10^3 \Omega$; $V_1(t_n)=V_2(t_n)=V_4(t_n)=0V$; $V_0(t_{n+1})=5V$; and $H=10^{-9}$ sec, the following values are calculated as $V_1(t_{n+1})=66/37$; $V_2(t_{n+1})=25/37$; $V_3(t_{1+1})=30/37$; and $V_4(t_{n+1})=15/37$. From this result, it is understood that rise of the voltage $V_4$ at the input node $N_4$ of the logic element $L_3$ is lagged from the rise of the voltage $V_3$ at the input node $N_3$ of the logic element $L_2$, and that the delay time between the nodes $N_0$ and $N_4$ is larger than that between the nodes $N_0$ and $N_3$.

In step S25, the voltage value/logic value converting portion 54 of FIG. 1 converts the voltage value and an input node of a logic element in the succeeding stage to a logic value, based on the threshold value for voltage/logic conversion.

In step S26, the control portion 2a determines whether or not the logic value at the next time at the input node of the logic element of the succeeding stage provided in step S25 is changed from the logic value at present. If the logic value is not changed at any of the input nodes of the logic element in the succeeding stage, simulation proceeds to step S28. However, if the logic value at the input node of one or more logic elements is changed, the simulation proceeds to step S27.

In step S27, the control portion 2a registers the event at the next time in the event table 3.

In step S28, the control portion 2a determines whether or not simulation is completed for every impedance circuit, and if it is not completed, the simulation returns to steps S21. Otherwise the simulation proceeds to step S9 of FIG. 4.

Figure 10:
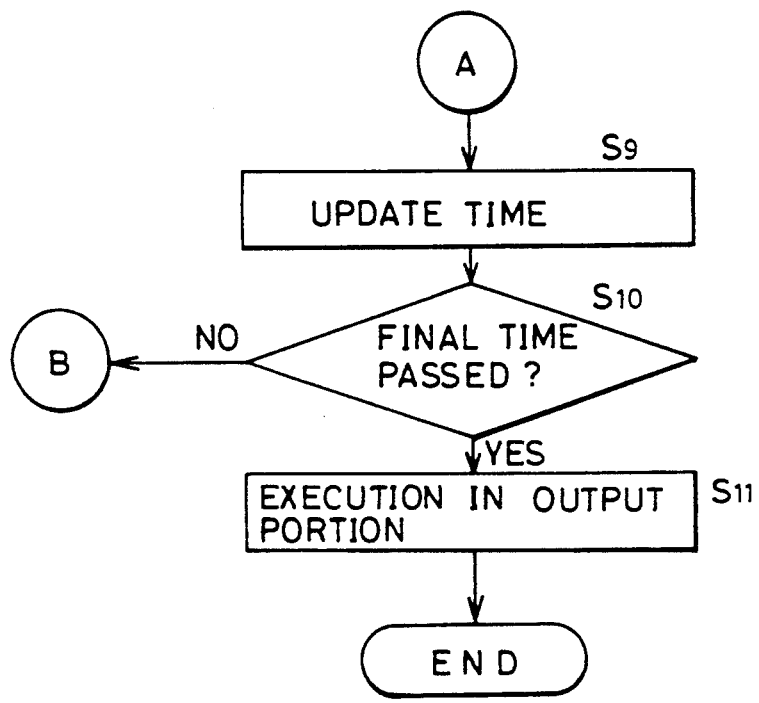
FIG. 10 shows another portion of the flow chart of the conventional logic simulation.
Figure 11:
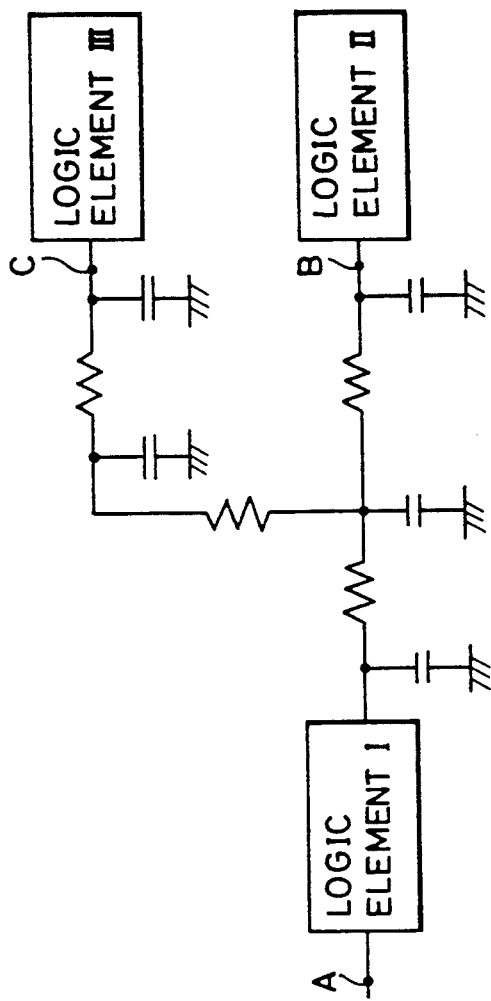
FIG. 11 shows one example of connection information between logic elements.

In steps S9 to S11 of FIG. 4, similar processing as in the corresponding steps of the prior art shown in FIG. 10 is executed, and the simulation is completed.

Although circuit equations are formed for every output impedance circuit in step S23 in the above described embodiment, circuit equations based on connection information may be prepared for every impedance circuit before the start of simulation.

As described above, by the logic simulation of the present invention, voltage value at an arbitrary node in an output impedance circuit can be calculated by solving a circuit equation based on connection information of the output impedance circuit of the logic element, and accordingly delay time between an input node of an arbitrary logic element and an input node of an arbitrary logic element in the succeeding stage can be estimated accurately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of simulating delay time in a logic circuit, comprising the steps of:

reading delay time of the logic element itself calculated in advance;

converting an output logic value of said logic element to a voltage value;

forming a circuit equation based on connection information of an output impedance circuit of said logic element;

calculating a voltage value at an arbitrary node of said output impedance circuit by solving said circuit equation; and converting a voltage value of an input node of a logic element in the succeeding stage to a logic value; whereby delay time between an input node of an arbitrary logic element and an input node of an arbitrary logic element of the succeeding stage can be accurately simulated.

2. A method according to claim 1, wherein said circuit equation is formed by using Kirchhoff's law.

3. A method according to claim 1, wherein said circuit equation is formed in advance before starting logic simulation.

4. A method according to claim 1, wherein delay time of said logic element itself is calculated based on an experiment.

5. A method according to claim 1, wherein delay time of said logic element itself is calculated by circuit simulation.

* * * * *